US012424534B2

(12) United States Patent
Matsuhashi (10) Patent No.: US 12,424,534 B2
(45) Date of Patent: Sep. 23, 2025

(54) WIRING SUBSTRATE (71) Applicant: Niterra Co., Ltd., Nagoya (JP)

(72) Inventor: Kensuke Matsuhashi, Nagoya (JP)

(73) Assignee: NITERRA CO., LTD., Nagoya (JP)

(*) Notice: Subject to any disclaimer, the term of this patent is extended or adjusted under 35 U.S.C. 154(b) by 273 days.

(21) Appl. No.: 18/263,163

(22) PCT Filed: Dec. 20, 2021

(86) PCT No.: PCT/JP2021/046921
§ 371 (c)(1),
(2) Date: Jul. 27, 2023

(87) PCT Pub. No.: WO2022/185673
PCT Pub. Date: Sep. 9, 2022

(65) Prior Publication Data
US 2024/0113008 A1 Apr. 4, 2024

(30) Foreign Application Priority Data

Mar. 2, 2021 (JP) ................................. 2021-032606

(51) Int. Cl.
H05K 1/03 (2006.01)
H01L 23/13 (2006.01)
H01L 23/14 (2006.01)
H01L 23/15 (2006.01)
H01L 23/498 (2006.01)
H05K 1/11 (2006.01)

(52) U.S. Cl.
CPC ........ *H01L 23/49838* (2013.01); *H01L 23/13* (2013.01); *H01L 23/142* (2013.01); *H01L 23/15* (2013.01); *H05K 1/11* (2013.01); *H05K 2201/09227* (2013.01)

(58) Field of Classification Search
CPC ........ H05K 1/182–185; H05K 1/0306; H05K 2201/017; H05K 1/11; H05K 3/4629; H05K 1/184; H01L 23/49838; H01L 23/13; H01L 23/142; H01L 23/15; H01L 23/053; H01L 23/10
See application file for complete search history.

(56) References Cited

FOREIGN PATENT DOCUMENTS

JP H07-147355 A 6/1995

OTHER PUBLICATIONS

Japan Patent Office, International Search Report issued in corresponding Application No. PCT/JP2021/046921, mailed Mar. 8, 2022.

*Primary Examiner* — Timothy J Thompson
*Assistant Examiner* — Aditya Sharma
(74) *Attorney, Agent, or Firm* — Stites & Harbison, PLLC; Jeffrey A. Haeberlin (57) ABSTRACT A wiring substrate includes a first ceramic layer and a second ceramic layer. A plurality of wiring traces which are electrically independent of one another are provided between the first ceramic layer and the second ceramic layer. Each wiring trace has a protruding portion which protrudes onto the first ceramic layer surrounded by the second ceramic layer when viewed from above. An insulating coat is provided to cover a portion of a concave corner formed by the second ceramic layer and the first ceramic layer.

6 Claims, 5 Drawing Sheets

WIRING SUBSTRATE

TECHNICAL FIELD

The present disclosure relates to a wiring substrate having a step for mounting a semiconductor chip or the like.

BACKGROUND ART

A semiconductor chip on which an integrated circuit, etc. are mounted is composed of various circuit elements, such as switching elements, resistors, capacitors, and the like. This semiconductor chip is mounted on a ceramic substrate formed of a ceramic material (a non-conductive material) and constitutes a modularized wiring substrate.

A wiring substrate on which a semiconductor chip is mounted includes a non-conductive ceramic substrate, and wiring patterns formed in the ceramic substrate and on the surface of the ceramic substrate by using an electrically conductive material such as metal, etc. Also, the wiring substrate on which the semiconductor chip is mounted has a step or a recess for receiving the semiconductor chip. This step or recess can be formed by stacking a plurality of ceramic substrates having different shapes.

For example, Patent Document 1 discloses a ceramic package main body for integrated circuit in which the inner circumferential wall of a recess for receiving an integrated circuit is formed to have a stepwise shape so that the inner circumferential wall has a step portion upper surface and a step portion side surface, and a plurality of metallized layers are formed to extend from the interior of the inner circumferential wall, pass through a boundary region between the step portion upper surface and the step portion side surface, and extend onto the step portion upper surface.

PRIOR ART DOCUMENT

Patent Document

Patent Document 1: Japanese Patent Application Laid-Open (kokai) No. H7-147355

SUMMARY OF THE INVENTION

Problem to be Solved by the Invention

In the ceramic package main body for integrated circuit disclosed in Patent Document 1, respective portions of the step portion upper surface and the plurality of metallized layers, which portions are located near the boundary region, are covered with an insulating coating layer. This configuration prevents occurrence of so-called "plating protrusion," which is a phenomenon that, at the time of plating of the metalized layers disposed on the step portion upper surface of the stepped inner circumferential wall to be juxtaposed to one another, ceramic portions present between the metalized layers are excessively plated. Therefore, formation of a short circuit between the metalized layers can be prevented.

Incidentally, a plurality of wiring traces formed on a wiring substrate may have different widths in some cases. When an insulating coating layer (also called "insulating coat") as described above is formed on such a wiring substrate on which a plurality of wiring traces having different widths are provided, separation of the insulating coating layer becomes more likely to occur at a wiring trace having a relatively large width. If such separation of the insulating coating layer occurs at the boundary of a step of the ceramic substrate, plating becomes more likely to enter the interior of the step, and may become a cause of a short circuit between adjacent wiring traces.

In view of the above, in one aspect of the present invention, a wiring substrate which can restrain separation of an insulating coat formed at a step portion of a ceramic substrate is provided.

Means for Solving the Problem

A wiring substrate according to one aspect of the present invention comprises: a first ceramic layer; a frame-shaped second ceramic layer which is stacked on the first ceramic layer and surrounds a portion of an upper surface of the first ceramic layer when viewed from above; and a plurality of wiring traces which are electrically independent of one another and are present between the first ceramic layer and the second ceramic layer, each wiring trace having a protruding portion which protrudes onto the first ceramic layer surrounded by the second ceramic layer when viewed from above. The wiring substrate comprises an insulating coat which covers a portion of a concave corner formed by an inner circumferential surface of the second ceramic layer, and the upper surface of the first ceramic layer and an upper surface of the protruding portion. An exposed region where the insulating coat is not provided is present at least on a wiring trace which is the largest, in terms of width of a part of the protruding portion, among the plurality of wiring traces, which part is located adjacent to the second ceramic layer when viewed from above.

In the above-described configuration, since the insulating coat is provided to cover the concave corner, it is possible to prevent occurrence of "plating protrusion," which is a phenomenon that, at the time of plating of the protruding portions of the wiring traces disposed on the upper surface of the first ceramic layer to be juxtaposed to one another, ceramic portions are excessively plated. Therefore, formation of a short circuit between the adjacent wiring traces can be prevented.

Furthermore, since the insulating coat is not provided at least on the wiring trace whose width is the largest among the plurality of wiring traces, it is possible to restrain separation of the insulating coat, which may occur when the insulation coat is formed on a wiring trace whose width is relatively large.

In the above-described wiring substrate according to the one aspect of the invention, the exposed region where the insulating coat is not provided may be present on the wiring trace whose width is 2.5 mm or more.

In the case where the insulating coat is provided on the wiring trace whose width is 2.5 mm or more, separation of the insulating coat occurs easily. The above-described configuration can more reliably prevent occurrence of separation of the insulating coat at some of the plurality of wiring traces.

The above-described wiring substrate according to the one aspect of the invention may be configured such that the insulating coat covers a wiring trace which is located adjacent to the wiring trace on which the exposed region is present, an end portion of the insulating coat is disposed on the first ceramic layer between these wiring traces, and the exposed region is provided over an entire region of the wiring trace in a width direction.

In the above-described configuration, since the end portion of the insulating coat is disposed on the ceramic layer, separation of the insulating coat can be restrained more reliably as compared with the case where the end portion of the insulating coat is located on the wiring trace.

In the above-described wiring substrate according to the one aspect of the invention, the wiring trace on which the exposed region is present may have a narrow width portion at the concave corner where the width of the wiring trace is decreased locally.

In the above-described configuration, the spacing between the wiring trace having the narrow width portion and a wiring trace disposed to be located adjacent thereto can be made larger. Therefore, it becomes easier to secure a region in which the end portion of the insulating coat is disposed, between these wiring traces, and it becomes easier to dispose the end portion of the insulating coat between the wiring traces.

In the above-described wiring substrate according to the one aspect of the invention, the exposed region located on the narrow width portion may have a width smaller than a width of the wiring trace at a position in the protruding portion other than the narrow width portion.

The above-described configuration enables provision of an area for joining the insulating coat and the first ceramic layer in a larger region while securing a bonding wire connection area on the protruding portion.

In the above-described wiring substrate according to the one aspect of the invention, a maximum width of the exposed region along the concave corner may be smaller than a maximum width of the wiring trace along the concave corner, and the insulating coat may be provided on an end portion of the wiring trace in the width direction.

In the above-described configuration, since a portion of the insulating coat is disposed between the second ceramic layer and the wiring trace at opposite end portions of the wiring trace in the width direction, gaps become less likely to be generated therebetween. Accordingly, entry of plating into the gaps is prevented, and "plating protrusion" becomes less likely to occur.

Effect of the Invention

The wiring substrate according to the one aspect of the present invention can restrain separation of an insulating coat formed on a step portion of a ceramic substrate.

MODES FOR CARRYING OUT THE INVENTION

Embodiments of the present invention will now be described with reference to the drawings. In the following description, identical components are denoted by the same reference numerals. Their names and functions are the same. Therefore, their detailed descriptions will not be repeated.

First Embodiment

In the present embodiment, a wiring substrate 1 will be described as one example of the wiring substrate according to the present invention. A semiconductor chip (semiconductor element) 51 is mounted on this wiring substrate 1, whereby a semiconductor module (also called semiconductor package) 50 is constituted.

Figure 1:
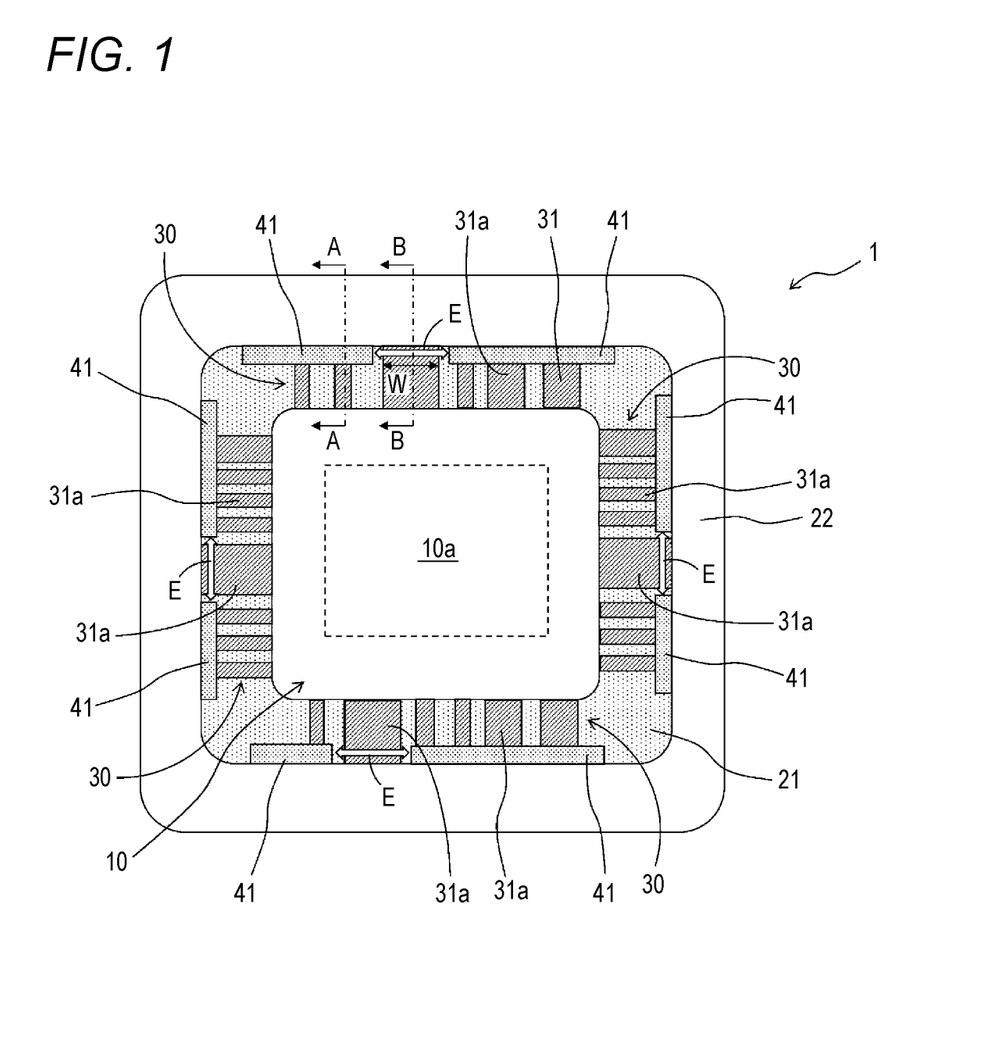
FIG. 1 Schematic plan view showing the structure of a wiring substrate according to one embodiment.

FIG. 1 schematically shows a planar structure of the wiring substrate 1. The wiring substrate 1 has an approximately quadrangular shape when viewed from above. The outer shape of the wiring substrate 1 is formed by a ceramic base member including a plurality of ceramic layers. A recess 10 having an approximately quadrangular shape when viewed from above is formed in a central portion of an upper surface of the ceramic base member. A bottom surface of the recess 10 has an element mounting portion 10a on which a semiconductor element such as the semiconductor chip 51 is mounted.

Figure 2:
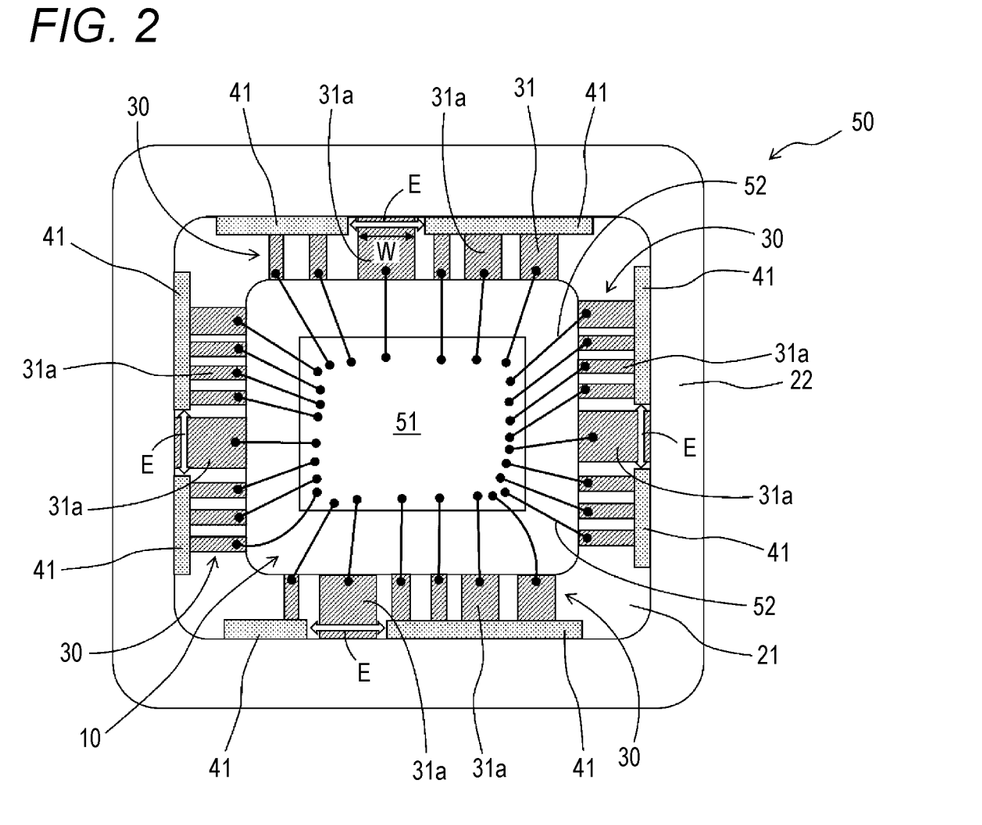
FIG. 2 Schematic plan view showing the structure of a semiconductor package in which a semiconductor element is mounted on the wiring substrate shown in FIG. 1.

The semiconductor chip 51 is mounted on the element mounting portion 10a of the wiring substrate 1 having the above-described structure. As a result, the semiconductor module 50 is obtained. FIG. 2 schematically shows the structure of the semiconductor module 50.

The wiring substrate 1 is electrically connected to the semiconductor chip 51 through bonding wires 52.

Specifically, respective wiring traces 31 contained in a wiring trace group 30 of the wiring substrate 1 are electrically connected to respective connection terminals (not shown) of the semiconductor chip 51 by the bonding wires 52. As a result, it becomes possible to transmit electrical signals between the respective wiring traces 31 and the semiconductor chip 51.

In a state in which the semiconductor chip 51 is mounted on the wiring substrate 1, a liquid resin material is poured into the recess 10 of the ceramic base member. As a result of hardening of this resin material, a state in which the recess 10 is filled with the resin is created. As a result, the semiconductor module 50 is obtained. Notably, the semiconductor module 50 may have a structure in which no resin material is poured into the recess 10 of the ceramic base member. Namely, in a different embodiment, the semiconductor module 50 is formed by mounting the semiconductor chip 51 on the wiring substrate 1 and electrically connecting the semiconductor chip 51 and the wiring substrate 1 to each other.

Figure 3:
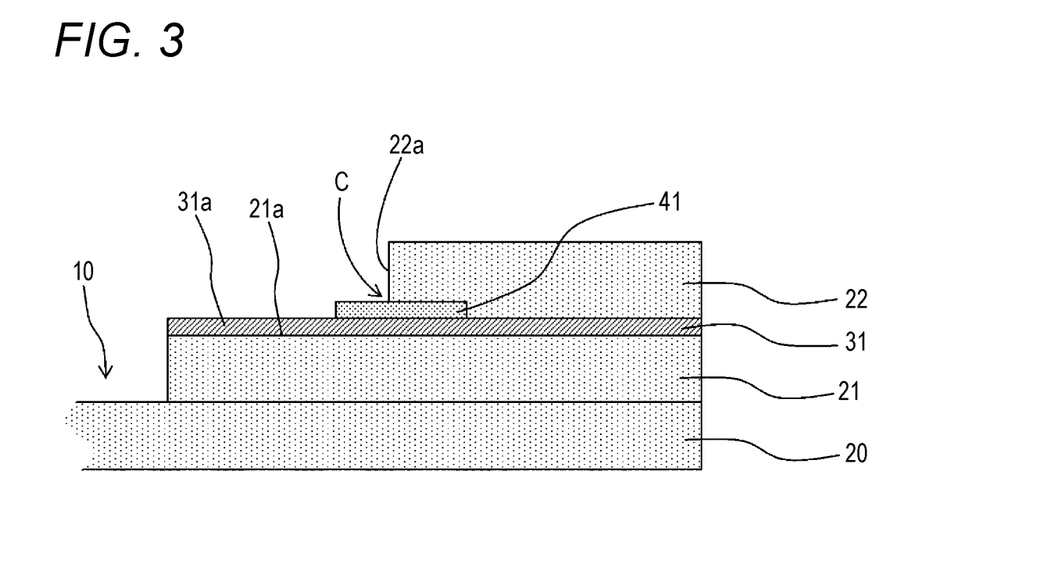
FIG. 3 Partial sectional view of the wiring substrate shown in FIG. 1, taken along a line A-A.
Figure 4:
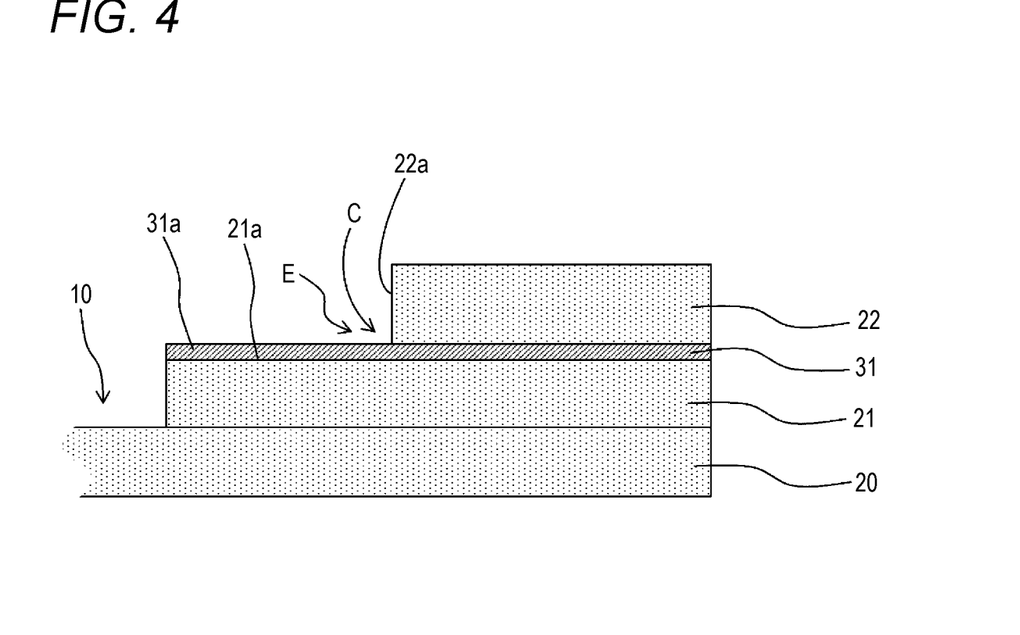
FIG. 4 Partial sectional view of the wiring substrate shown in FIG. 1, taken along a line B-B.

FIGS. 3 and 4 show sectional structures of portions of the wiring substrate 1. FIG. 3 is a partial sectional view of the wiring substrate 1 shown in FIG. 1, taken along a line A-A. FIG. 4 is a partial sectional view of the wiring substrate 1 shown in FIG. 1, taken along a line B-B.

The wiring substrate 1 has a layered structure in which a plurality of ceramic layers are mainly stacked. In the present embodiment, the wiring substrate 1 has a structure in which a base ceramic layer 20, a first ceramic layer 21, and a second ceramic layer 22 are stacked in this order from the lower side.

Each ceramic layer can be formed of, for example, a high-temperature fired ceramic material whose main component is alumina ($Al_2O_3$). In a different embodiment, the ceramic sheet may be formed of meddle-temperature fired ceramic (MTCC) or low-temperature fired ceramic (LTCC) such as glass-ceramic.

The base ceramic layer 20 has the shape of an approximately quadrangular flat plate. A central portion of an upper surface of the base ceramic layer 20 serves as the element mounting portion 10a.

The first ceramic layer 21 has the shape of an approximately quadrangular flat plate whose size is approximately the same as the base ceramic layer 20. The first ceramic layer 21 has an opening at its central portion; i.e., has a frame-like shape. The first ceramic layer 21 is stacked on the base ceramic layer 20 such that the first ceramic layer 21 surrounds an outer circumferential portion of the upper surface of the base ceramic layer 20 when viewed from above.

Notably, in the present embodiment, the first ceramic layer 21 has an opening at its central portion; i.e., has a frame-like shape. However, in one aspect of the present invention, a structure in which the first ceramic layer 21 has no opening is possible. For example, in the case where the wiring substrate has a two-layer structure; i.e., has the first ceramic layer 21 and the second ceramic layer 22, the first ceramic layer 21 may have the shape of a flat plate having no opening.

The second ceramic layer 22 has the shape of an approximately quadrangular flat plate whose size is approximately the same as the base ceramic layer 20 and the first ceramic layer 21. The second ceramic layer 22 has an opening at its central portion; i.e., has a frame-like shape. The opening of the second ceramic layer 22 has an opening area greater than that of the opening of the first ceramic layer 21. The second ceramic layer 22 is stacked on the first ceramic layer 21 such that the second ceramic layer 22 surrounds an outer circumferential portion of the upper surface of the first ceramic layer 21 when viewed from above.

By virtue of the above-described structure, the recess 10 is formed at the central portion of the upper surface of the ceramic base member of the wiring substrate 1. Also, steps are formed by the openings formed in the first ceramic layer 21 and the second ceramic layer 22 and having different sizes such that the steps extend from the bottom surface of the recess 10 toward the upper surface of the second ceramic layer 22 (see FIG. 3, etc.).

Of these steps, one step is formed by the first ceramic layer 21 and the second ceramic layer 22. At this step, a wiring trace group 30 composed of a plurality of wiring traces 31, etc. are provided on an upper surface 21a of the first ceramic layer 21. In FIG. 1, a dotted pattern is added to this step. A region formed by the upper surface 21a of the first ceramic layer 21 and an inner circumferential surface 22a of the opening of the second ceramic layer 22 will be referred to as a concave corner C (see FIG. 3, etc.).

The wiring trace group 30 formed on the upper surface 21a of the first ceramic layer 21 is formed by a conductive pattern obtained by shaping an electrically conductive material into a predetermined shape. The conductive pattern can be formed of a metal material such as copper (Cu), tungsten (W), silver (Ag), palladium (Pd), gold (Au), molybdenum (Mo), nickel (Ni), or manganese (Mn), or formed of an alloy material which contains any of these metal materials as a main component.

A conventionally known method is used for formation of the conductive pattern. Examples of the conventionally known method include a metallization method using printing paste and a method in which a patterned metal layer is transferred. Of these methods, for example, the metallization method is preferably used.

The respective wiring traces 31 constituting the wiring trace group 30 extend from the opening side of the upper surface 21a of the first ceramic layer 21 toward respective end portions at the outer periphery. The direction in which the respective wiring traces 31 extend will be referred to as the extension direction of the wiring traces 31.

In the present embodiment, as shown in FIG. 1, the respective wiring traces 31 extend straight, on the upper surface 21a of the approximately quadrangular first ceramic layer 21, from its four edges toward respective edges of the opening. A plurality of wiring traces 31 are disposed along one edge in such a manner that the wiring traces 31 are approximately parallel to one another, and a spacing L (see FIG. 5) is provided between adjacent wring traces 31. The size of the spacing L may be constant or may vary. As a result, the wiring trace group 30 composed of the plurality of wiring traces 31 electrically independent of one another is constituted. Notably, the pattern configuration of the respective wiring traces 31 shown in FIG. 1 is one example, and the present invention is not limited thereto.

As shown in FIG. 3, etc., a portion of each wiring trace 31 (a portion on the side toward the recess 10 of the wiring substrate 1) is located on the upper surface 21a of the first ceramic layer 21, which forms a step, and the remaining portion (a portion on the side toward the outer periphery of the wiring substrate 1) is present between the first ceramic layer 21 and the second ceramic layer 22. A portion of each wiring trace 31, which portion protrudes onto the upper surface 21a of the first ceramic layer 21 forming a step will be referred to as a protruding portion 31a. Notably, as shown in FIGS. 3, 4, etc., a part of the protruding portion 31a is formed at the concave corner C. The surface of the protruding portion 31a of each wiring trace 31 is covered with a plating layer (not shown).

In the semiconductor module 50, in which the semiconductor chip 51 is mounted on the wiring substrate 1, the respective wiring traces 31 are electrically connected to respective connection terminals (not shown) of the semiconductor chip 51 by the bonding wires 52. As shown in FIG. 2, ends of the bonding wires 52 are attached to the protruding portions 31a of the respective wiring traces 31. As a result, it becomes possible to transmit electrical signals between the respective wiring traces 31 and the semiconductor chip 51.

Also, at the step formed by the first ceramic layer 21 and the second ceramic layer 22, an alumina coat (insulating coat) 41 is provided at the concave corner C formed by the inner circumferential surface 22a of the opening of the second ceramic layer 22 and "the upper surface 21a of the first ceramic layer 21 and the protruding portion 31a of each wiring trace 31." As shown in FIG. 3, a portion of the alumina coat 41 is sandwiched between the first ceramic layer 21 and the second ceramic layer 22, and the remaining portion is disposed on the upper surface 21a of the first ceramic layer 21 at the concave corner C.

As shown in FIG. 1, the alumina coat 41 is not formed over the entire region of the concave corner C but is formed on a portion of the concave corner C. The alumina coat is formed of the same material as the ceramic layer such as the first ceramic layer 21. Therefore, when the ceramic layer with the alumina coat mounted thereon is fired, the alumina coat is integrated with the ceramic layer, so that the adhesion of conductive patterns, such as the wiring traces 31, which are sandwiched between the alumina coat and the ceramic layer, is enhanced.

Also, since the alumina coat 41 is provided at the concave corner C, it is possible to prevent occurrence of "plating protrusion," which is a phenomenon that, at the time of plating of the wiring traces 31 disposed on the upper surface of the first ceramic layer 21, which forms a step in the ceramic base member, to be juxtaposed to one another, ceramic portions present between the respective wiring traces 31 are excessively plated. Therefore, formation of a short circuit between the adjacent wiring traces 31 can be prevented.

Notably, a short circuit is easily formed between wiring traces due to "plating protrusion" when the spacing between adjacent wiring traces is narrow (for example, when the spacing is 200 µm or less). In view of this, in the present embodiment, provision of the alumina coat 41 is preferred when the spacing L between adjacent wiring traces 31 is 200 µm or less, and provision of the alumina coat 41 is more preferred when the spacing L is 100 µm or less.

Figure 5:
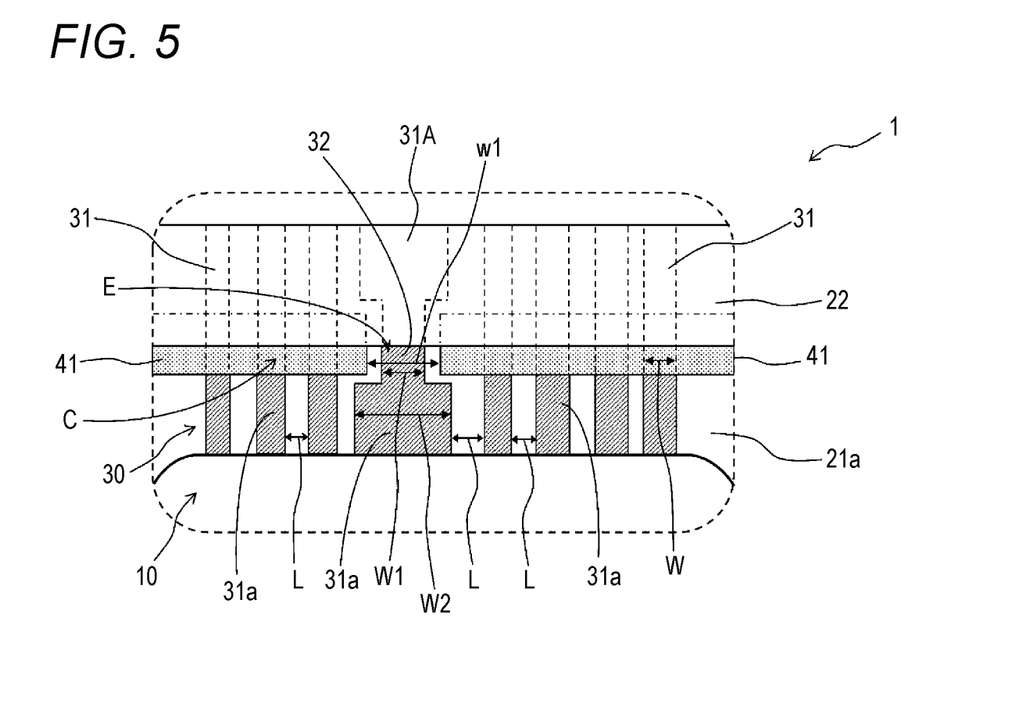
FIG. 5 Plan view showing the structure of a portion of a wiring substrate according to a first embodiment.
Figure 8:
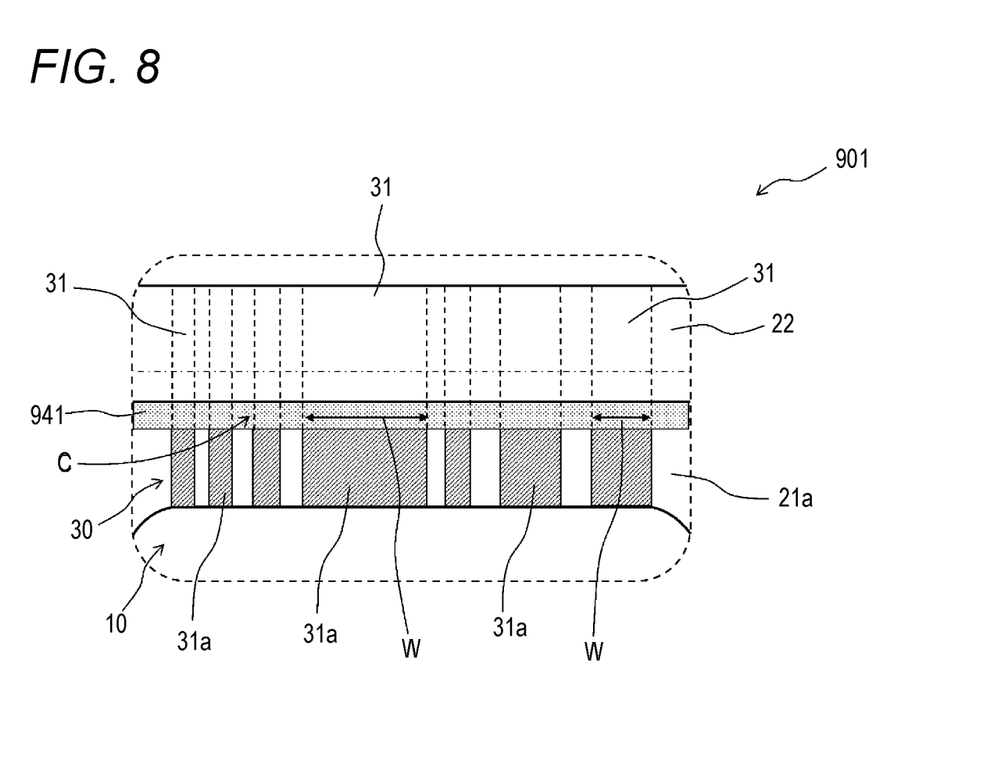
FIG. 8 Plan view showing the structure of a portion of a conventional wiring substrate.

In the below, a specific example of the region where the alumina coat 41 is formed will be described with reference to FIG. 5. FIG. 5 shows, on an enlarged scale, a portion of the upper surface of a wiring substrate 1 according to the first embodiment, which portion extends along one edge of the wiring substrate 1. Also, for comparison, FIG. 8 shows the configuration of a portion of the upper surface of a conventional wiring substrate 1, which portion extends along one edge of the wiring substrate.

A wiring trace group 30 composed of a plurality of wiring traces 31 (specifically, eight wiring traces 31) having different widths is provided along one edge of the wiring substrate 1 shown in FIG. 5. Herein, the width of each wiring trace 31 means the length of the protruding portion 31a of the wiring trace 31 in a direction perpendicular to the extension direction of the wiring trace 31 on the upper surface 21a of the first ceramic layer 21.

Also, in the present embodiment, the width of a part of the protruding portion 31a, which part is located adjacent to the second ceramic layer 22 as viewed from above, (namely, a corner portion of the concave corner C) will be referred to as the width W. Notably, as for wiring traces 31 whose widths are relatively small, their widths are constant in their extension directions and coincide with the width W. Meanwhile, as for a wiring trace 31 whose width is relatively large (for example, a wiring trace 31A), the width of the wiring trace 31 changes locally. In this case, the width of a part of the protruding portion 31a, which part is located adjacent to the second ceramic layer 22 as viewed from above, (namely, a corner portion of the concave corner C) will be referred to as the width W1, and the width of the remaining part will be referred to as the width W2.

In the present embodiment, as shown in FIG. 5, the alumina coat 41 is not provided on a wiring trace 31 whose width W is the largest (namely, the wiring trace 31A having the width W1) among the plurality of wiring traces 31 disposed to be juxtaposed to one another along one edge of the wiring substrate 1 with the spacing L provided therebetween and on regions on the left and right sides of the wiring trace whose width W is the largest. Namely, the alumina coat 41 is not present on the wiring trace 31A having the width W1 and regions of the first ceramic layer 21, which regions are adjacently located on the left and right sides thereof, whereby an exposed region E where the surface of the wiring trace 31, etc. are exposed is formed.

As described above, the exposed region E where the alumina coat 41 is not provided is present at least on the wiring trace 31A whose width W is the largest among the plurality of the wiring traces 31. As a result, it is possible to restrain separation of the alumina coat 41, which may occur when the alumina coat 41 is formed on a wiring trace 31 whose width W is relatively large.

For comparison, the structure of a conventional wiring substrate 901 will be described with reference to FIG. 8. FIG. 8 shows the planar structure of a portion of the wiring substrate 901.

Like the wiring substrate 1 of the present embodiment, the outer shape of the wiring substrate 901 is formed by a ceramic base member. A recess 10 having an approximately quadrangular shape when viewed from above is formed in a central portion of the upper surface of the ceramic base member.

A wiring trace group 30 composed of a plurality of wiring traces 31 (specifically, seven wiring traces 31) having different widths is provided along one edge of the wiring substrate 901 shown in FIG. 8.

In the wiring substrate 901 shown in FIG. 8, at the step formed by the first ceramic layer 21 and the second ceramic layer 22, an alumina coat 941 is provided over the entire region of the concave corner C formed by the inner circumferential surface 22a of the opening of the second ceramic layer 22 and "the upper surface 21a of the first ceramic layer 21 and the protruding portion 31a of each wiring trace 31."

Namely, the alumina coat 941 is provided on all the wiring traces 31 irrespective of the width W of each wiring trace 31. In such a structure, the alumina coat 941 formed on a wiring trace 31 whose width W is large does not adhere to the surface of the wiring traces 31, and separation of the alumina coat 941 may occur. When such separation of the alumina coat 941 occurs, at the time of plating of the surface of the wiring trace 31, plating solution becomes more likely to enter the gap between the wiring trace 31 and the separated alumina coat 941, which may become a cause of a short circuit between adjacent wiring traces.

In view of the above, in the wiring substrate 1 according to the present embodiment, the exposed region E where the alumina coat 41 is not provided is present on at least the wiring trace whose width W is the largest among the plurality of wiring traces 31.

In the present embodiment, the alumina coat 41 covers the wiring traces 31 located adjacent to the wiring trace 31A where the exposed region E is present, and end portions of the alumina coat 41 are disposed on the first ceramic layer 21 between these wiring traces. The exposed region E present on the wiring trace 31A extends over the entire region of the wiring trace 31A in the width direction. Since end portions of the alumina coat 41 are disposed on the first ceramic layer 21, separation of the alumina coat 41 can be restrained more reliably as compared with the case where the end portions of the alumina coat 41 are located on the wiring trace.

Notably, the above-described alumina coat separation is apt to occur at a wiring trace 31 whose width W is 2.5 mm or more. Therefore, it is preferred that the exposed region E where the alumina coat 41 is not provided be present on a wiring trace 31 whose width W is 2.5 mm or more.

Namely, in the wiring substrate 1, it is preferred that the exposed region E be present not only on the wiring trace 31 whose width W is the largest but also on the wiring trace 31 whose width W is 2.5 mm or more, among the plurality of wiring traces 31 disposed to be juxtaposed to one another along each edge. As a result, alumina coat separation can be restrained more reliably.

Also, in the wiring substrate 1 according to the present embodiment, the wiring trace 31A, on which the exposed region E is present, has a narrow width portion 32 at the concave corner C where the width of the wiring trace is narrowed locally.

By virtue of this configuration, the spacing between the wiring trace 31 having the narrow width portion 32 and a wiring trace 31 located adjacent thereto (namely, the width of a portion of the first ceramic layer 21 located between adjacent wiring traces 31) can be made larger. Therefore, it becomes easier to secure regions where end portions of the alumina coat 41 are disposed, between the wiring trace 31A having the narrow width portion 32 and the wiring traces 31 adjacent thereto, while providing the exposed region E over the entire region of the wiring trace 31A in the width direction. Accordingly, it becomes easier to dispose the end portions of the alumina coat 41 on regions of the first ceramic layer 21 present between the wiring traces.

The wiring trace 31 having such a narrow width portion 32 is formed such that the width W1 of the narrow width portion 32 is grater than the widths W of other wiring traces 31. Namely, the width W2 is the largest among the widths W of the plurality of wiring traces 31 disposed to be juxtaposed to one another along one edge. Also, it is preferred that this width W1 be 2.5 mm or greater.

As shown in FIG. 5, cutouts are formed on the left and right sides of the narrow width portion 32 in the width direction by partially removing the conductive pattern. The alumina coat 41 is provided to enter these cutouts. Namely, the width w1 of the exposed region E located on the narrow width portion 32 is smaller than the width W2 of the wiring trace 31A at positions other than the narrow width portion 32. By virtue of this configuration, it becomes easier to secure regions where end portions of the alumina coat 41 are disposed, between the wiring trace 31A and the wiring traces 31 adjacent thereto, while providing the exposed region E on the narrow width portion 32. Accordingly, it becomes easier to dispose the end portions of the alumina coat 41 in larger regions of the first ceramic layer 21 present between the wiring traces.

Notably, in the case where the wiring trace group 30 includes a plurality of wiring traces 31 whose widths W are the largest, the exposed region E where the alumina coat 41 is not provided may be present on all of these wiring traces 31.

As in the example shown in FIG. 1, the exposed region E where the alumina coat 41 is not provided may be present on the wiring trace 31 whose width W is the largest among the plurality of wiring traces 31 disposed to be juxtaposed to one another along the same side such that a spacing is provided between adjacent wiring traces 31. Namely, the exposed region E may be present along each of the four edges of the approximately quadrangular wiring substrate 1. Also, a plurality of exposed regions E may be present in a single wiring substrate 1.

The width W of each wiring trace 31 can be measured by applying X rays from the upper surface side of the wiring substrate 1 by using an X-ray irradiator (for example, a microfocus X-ray CT system (produced by Unihite System Corporation, Model Number: XVA-160N).

Summary of First Embodiment

As described above, the wiring substrate 1 according to the present embodiment includes a first ceramic layer 21 and a frame-shaped second ceramic layer 22 which is stacked on the first ceramic layer 21 and surrounds a portion of the upper surface of the first ceramic layer 21 when viewed from above. A plurality of wiring traces 31 which are electrically independent of one another are provided between the first ceramic layer 21 and the second ceramic layer 22. Each wiring trace 31 has a protruding portion 31a protruding onto a region of the first ceramic layer 21 surrounded by the second ceramic layer 22 when viewed from above.

At a concave corner C formed by the inner circumferential surface 22a of the second ceramic layer 22 and "the upper surface 21a of the first ceramic layer 21 and the upper surface of the protruding portion 31a," an alumina coat (insulating coat) 41 is provided to cover a part of the concave corner C. An exposed region E where the alumina coat 41 is not provided is present on at least a wiring trace which is one of the plurality of wiring traces 31 and whose width W is the largest. Namely, the exposed region E is a region where the concave corner C formed by the inner circumferential surface 22a of the second ceramic layer and the upper surface of the wiring trace 31 is exposed (see FIG. 4).

By virtue of the above-described configuration, it is possible to restrain separation of the alumina coat 41, which may occur when the alumina coat 41 is formed on a wiring trace 31 whose width W is relatively large. Notably, in the case where a plurality of wiring traces 31 whose widths W are the largest are present, it is preferred that the exposed region E where the alumina coat 41 is not provided be present on all of these wiring traces 31.

In the present embodiment, alumina coat is mentioned as an example of the insulating coat. However, the material of the insulating coat is not limited to alumina so long as the material of the insulating coat is electrically non-conducive.

Second Embodiment

Figure 6:
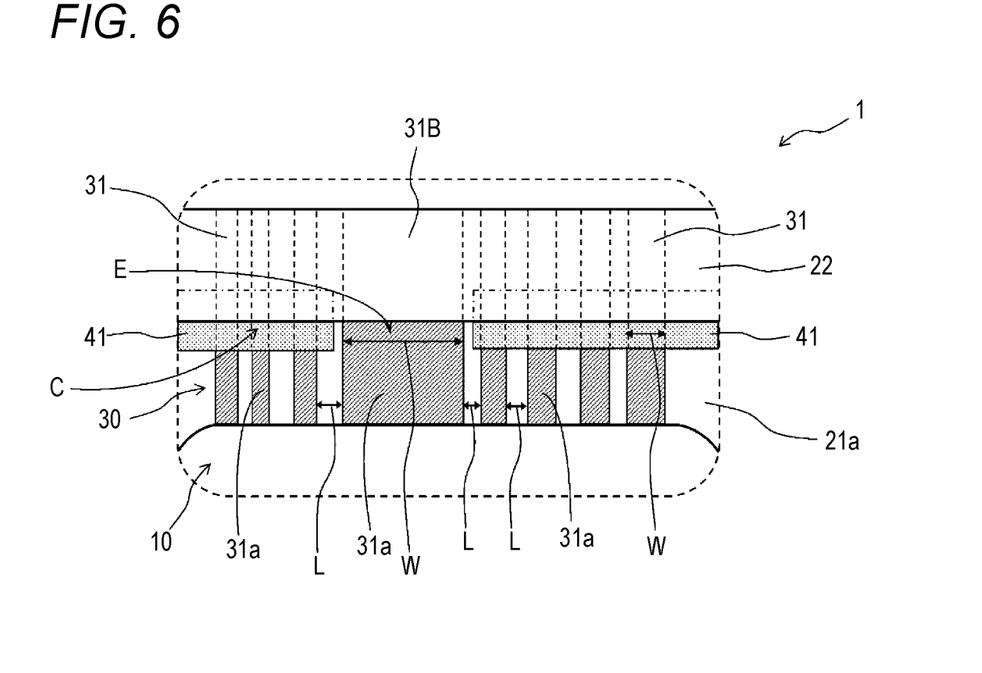
FIG. 6 Plan view showing the structure of a portion of a wiring substrate according to a second embodiment.

Next, a wiring substrate 1 according to a second embodiment will be described with reference to FIG. 6. FIG. 6 shows, on an enlarged scale, a portion of the upper surface of the wiring substrate 1 according to the second embodiment, which portion extends along one edge of the wiring substrate 1.

A wiring trace group 30 composed of a plurality of wiring traces 31 (specifically, eight wiring traces 31) having different widths is provided along one edge of the wiring substrate 1 shown in FIG. 6. Herein, the width of each wiring trace 31 means the length of the protruding portion 31a of the wiring trace 31 in a direction perpendicular to the extension direction of the wiring trace 31 on the upper surface 21a of the first ceramic layer 21. Also, in the present embodiment, the width of a part of the protruding portion 31a, which part is located adjacent to the second ceramic layer 22 as viewed from above, (namely, a corner portion of the concave corner C) will be referred to as the width W.

In the present embodiment, as shown in FIG. 6, the alumina coat 41 is not provided on a wiring trace whose width W is the largest (namely, the wiring trace 31B) among the plurality of wiring traces 31 disposed to be juxtaposed to one another along one edge of the wiring substrate 1 with the spacing L provided therebetween and on regions on the left and right sides of the wiring trace whose width W is the largest. Namely, the alumina coat 41 is not present on the wiring trace 31B and regions of the first ceramic layer 21, which regions are adjacently located on the left and right sides thereof, whereby an exposed region E where the surface of the wiring trace 31, etc. are exposed is formed.

As described above, the exposed region E where the alumina coat 41 is not provided is present at least on the wiring trace 31B whose width W is the largest among the plurality of the wiring traces 31. As a result, it is possible to restrain separation of the alumina coat 41, which may occur when the alumina coat 41 is formed on a wiring trace 31 whose width W is relatively large.

In the present embodiment, the widths of all the wiring traces 31 contained in the wiring trace group 30 are constant in their extension directions. Namely, the wiring trace 31B does not have the narrow width portion 32, which is provided for the wiring trace 31A described in the first embodiment.

As described above, in the wiring substrate 1 according to the present embodiment, the exposed region E where the alumina coat 41 is not provided is present on at least a wiring trace which is one of the plurality of wiring traces 31 and whose width W is the largest (namely, the wiring trace 31B).

In the present embodiment, the alumina coat 41 covers the wiring traces 31 located adjacent to the wiring trace 31B where the exposed region E is present, and end portions of the alumina coat 41 are disposed on the first ceramic layer 21 between these wiring traces. The exposed region E present on the wiring trace 31B extends over the entire region of the wiring trace 31B in the width direction. Since end portions of the alumina coat 41 are disposed on the first ceramic layer 21, separation of the alumina coat 41 can be restrained more reliably as compared with the case where the end portions of the alumina coat 41 are located on the wiring trace.

Notably, the above-described alumina coat separation is apt to occur at a wiring trace 31 whose width W is 2.5 mm or more. Therefore, it is preferred that the exposed region E where the alumina coat 41 is not provided be present on a wiring trace 31 whose width W is 2.5 mm or more.

Also, in the wiring substrate 1, it is preferred that the exposed region E be present not only on the wiring trace 31 whose width W is the largest but also on the wiring trace 31 whose width W is 2.5 mm or more, among the plurality of wiring traces 31 disposed to be juxtaposed to one another along each edge. As a result, alumina coat separation can be restrained more reliably.

Third Embodiment

Figure 7:
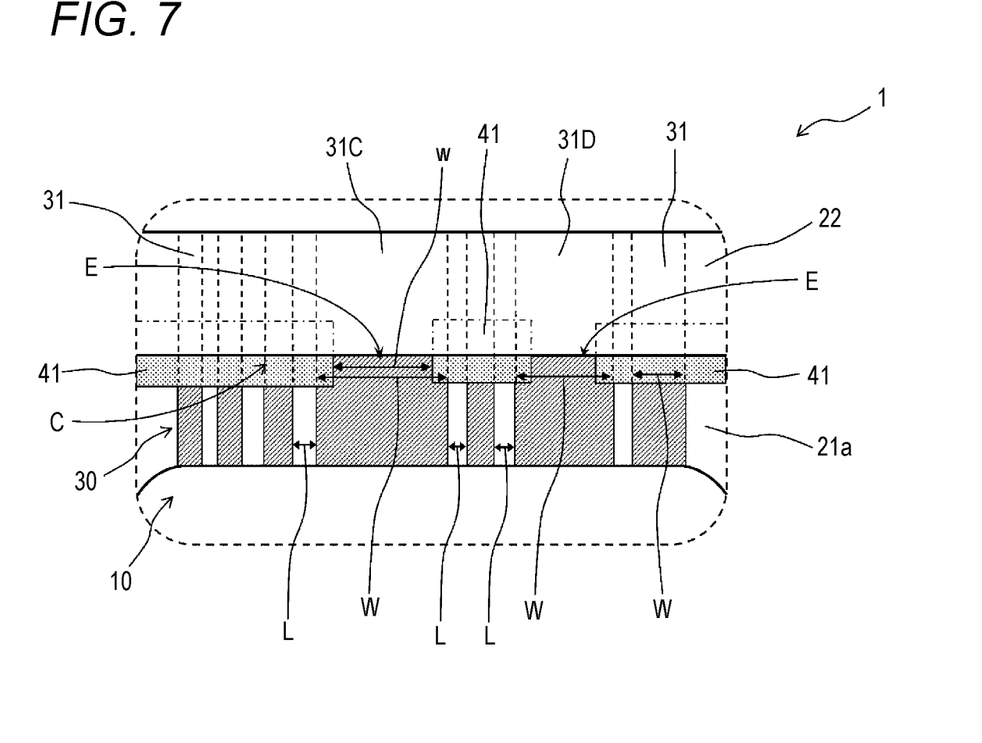
FIG. 7 Plan view showing the structure of a portion of a wiring substrate according to a third embodiment.

Next, a wiring substrate 1 according to a third embodiment will be described with reference to FIG. 7. FIG. 7 shows, on an enlarged scale, a portion of the upper surface of the wiring substrate 1 according to the third embodiment, which portion extends along one edge of the wiring substrate 1.

A wiring trace group 30 composed of a plurality of wiring traces 31 (specifically, seven wiring traces 31) having different widths is provided along one edge of the wiring substrate 1 shown in FIG. 7. Herein, the width of each wiring trace 31 means the length of the protruding portion 31a of the wiring trace 31 in a direction perpendicular to the extension direction of the wiring trace 31 on the upper surface 21a of the first ceramic layer 21. Also, in the present embodiment, the width of a part of the protruding portion 31a, which part is located adjacent to the second ceramic layer 22 as viewed from above, (namely, a corner portion of the concave corner C) will be referred to as the width W.

In the present embodiment, as shown in FIG. 7, the alumina coat 41 is not provided on central portions in the width direction (hereinafter referred to as the "widthwise central portions") of wiring traces 31 which are a part of the plurality of wiring traces 31 disposed to be juxtaposed to one another along one edge of the wiring substrate 1 with the spacing L provided therebetween and whose widths W are equal to or greater than a predetermined value (for example, 2.5 mm or more) (namely, the wiring traces 31C and 31D). Namely, the alumina coat 41 is not present on the wiring traces 31C and 31D except for portions thereof, so that exposed regions E where the surface of the wiring traces 31 are exposed are formed.

As described above, the exposed regions E where the alumina coat 41 is not provided are present at least on the widthwise central portions of the wiring traces 31C and 31D whose widths W are equal to or greater than the predetermined value, among the plurality of the wiring traces 31. As a result, it is possible to restrain separation of the alumina coat 41, which may occur when the alumina coat 41 is formed on a wiring trace 31 whose width W is relatively large.

In the present embodiment, the widths of all the wiring traces 31 contained in the wiring trace group 30 are constant in their extension directions. Namely, the wiring traces 31C and 31D do not have the narrow width portion 32, which is provided for the wiring trace 31A described in the first embodiment.

Also, in the present embodiment, the maximum width of the exposed region E along the concave corner C is smaller than the maximum width of the wiring trace 31 along the concave corner C. For example, as shown in FIG. 7, the width w of the exposed region E along the concave corner C is smaller than the width W of the corresponding wiring trace 31 along the concave corner C. The alumina coat 41 is provided on end portions of the wiring trace 31 on the left and right side in the width direction.

In this configuration, opposite ends of the wiring traces 31C and 31D in the width direction are sandwiched between the alumina coat 41 and the upper surface 21a of the first ceramic layer 21. As a result, gaps become less likely to be generated in the vicinity of end portions (in the width direction) of the wiring traces 31 present between the first ceramic layer 21 and the second ceramic layer 22. Accordingly, entry of plating into the gaps is prevented, and "plating protrusion" becomes less likely to occur.

It should be considered that the embodiments disclosed this time are illustrative and are not restrictive in all aspects. It is intended that the scope of the present invention is shown by the claims rather than the above-described explanation and that the present invention encompasses all modifications within the meaning and scope equivalent to the claims. Also, the present invention encompasses configurations obtained by mutually combining the configurations of different embodiments described in the present specification.

DESCRIPTION OF REFERENCE NUMERALS AND SYMBOLS

1: wiring substrate
10: recess
10a: element mounting portion
20: base ceramic layer
21: first ceramic layer
21a: upper surface of the first ceramic layer
22: second ceramic layer
22a: inner circumferential surface of the second ceramic layer
30: wiring trace group
31: wiring trace
31a: protruding portion
32: narrow width portion
41: alumina coat (insulating coat)
50: semiconductor module
51: semiconductor element
C: concave corner
E: exposed region
W: wiring trace width at the concave corner

What is claimed is:

1. A wiring substrate comprising:
a first ceramic layer;
a frame-shaped second ceramic layer which is stacked on the first ceramic layer and surrounds a portion of an upper surface of the first ceramic layer when viewed from above; and
a plurality of wiring traces which are electrically independent of one another and are present between the first ceramic layer and the second ceramic layer, each wiring trace having a protruding portion which protrudes onto the first ceramic layer surrounded by the second ceramic layer when viewed from above,
wherein the wiring substrate comprises an insulating coat which covers a portion of a concave corner formed by an inner circumferential surface of the second ceramic layer, and the upper surface of the first ceramic layer and an upper surface of the protruding portion, and
wherein an exposed region where the insulating coat is not provided is present at least on a wiring trace which is the largest, in terms of width of a part of the protruding portion, among the plurality of wiring traces, which part is located adjacent to the second ceramic layer when viewed from above.

2. A wiring substrate according to claim 1, wherein the exposed region where the insulating coat is not provided is present on the wiring trace whose width is 2.5 mm or more.

3. A wiring substrate according to claim 1, wherein the insulating coat covers a wiring trace which is located adjacent to the wiring trace on which the exposed region is present, and an end portion of the insulating coat is disposed on the first ceramic layer between these wiring traces, and
wherein the exposed region is provided over an entire region of the wiring trace in a width direction.

4. A wiring substrate according to claim 3, wherein the wiring trace on which the exposed region is present has a narrow width portion at the concave corner where the width of the wiring trace is decreased locally.

5. A wiring substrate according to claim 4, wherein the exposed region located on the narrow width portion has a width smaller than a width of the wiring trace at a position in the protruding portion other than the narrow width portion.

6. A wiring substrate according to claim 1, wherein a maximum width of the exposed region along the concave corner is smaller than a maximum width of the wiring trace along the concave corner, and
wherein the insulating coat is provided on an end portion of the wiring trace in a width direction.

* * * * *